United States Patent
Liang et al.

(10) Patent No.: US 11,114,401 B2
(45) Date of Patent: Sep. 7, 2021

(54) BONDING STRUCTURE AND METHOD FOR MANUFACTURING THE SAME

(71) Applicant: Wuhan Xinxin Semiconductor Manufacturing Co., Ltd., Hubei (CN)

(72) Inventors: Fei Liang, Hubei (CN); Jing Cao, Hubei (CN); Sheng Hu, Hubei (CN)

(73) Assignee: Wuhan Xinxin Semiconductor Manufacturing Co., Ltd., Hubei (CN)

(*) Notice: Subject to any disclaimer, the term of this patent is extended or adjusted under 35 U.S.C. 154(b) by 0 days.

(21) Appl. No.: 16/584,331

(22) Filed: Sep. 26, 2019

(65) Prior Publication Data

US 2020/0365539 A1    Nov. 19, 2020

(30) Foreign Application Priority Data

May 17, 2019   (CN) .......................... 201910411972.2

(51) Int. Cl.
  *H01L 23/00*   (2006.01)
  *H01L 21/304*  (2006.01)
  *H01L 25/065*  (2006.01)

(52) U.S. Cl.
  CPC ............ *H01L 24/06* (2013.01); *H01L 21/304* (2013.01); *H01L 24/32* (2013.01); *H01L 25/0657* (2013.01)

(58) Field of Classification Search
  CPC ..... H01L 25/0657; H01L 24/06; H01L 24/32; H01L 24/27; H01L 21/304; H01L 21/78; H01L 24/29; H01L 2225/0651; H01L 2225/06565
  See application file for complete search history.

(56) References Cited

U.S. PATENT DOCUMENTS

| | | | |
|---|---|---|---|
| 10,325,881 B2 | 6/2019 | Upadhyayula et al. | |
| 2008/0315388 A1* | 12/2008 | Periaman | H01L 25/0652 257/690 |
| 2012/0211878 A1 | 8/2012 | Popovic et al. | |
| 2018/0047706 A1 | 2/2018 | Upadhyayula et al. | |

FOREIGN PATENT DOCUMENTS

| CN | 105513943 A | 4/2016 |
|---|---|---|
| CN | 107706170 A | 2/2018 |

* cited by examiner

*Primary Examiner* — Jasmine J Clark
(74) *Attorney, Agent, or Firm* — Harness, Dickey & Pierce, P.L.C.

(57) ABSTRACT

A bonding structure and a method for manufacturing the bonding structure are provided. Multiple chips arranged in an array are formed on a surface of a wafer. Each of the chips includes a device structure, an interconnect structure electrically connected to the device structure, and a first package pad layer electrically connected to the interconnect structure. The first package pad layer is arranged at an edge region of the chip. A chip stack is obtained after bonding and cutting the multiple wafers, and the first package pad layer at the edge region of the chip is exposed.

12 Claims, 7 Drawing Sheets

BONDING STRUCTURE AND METHOD FOR MANUFACTURING THE SAME

CROSS REFERENCE TO RELATED APPLICATION

The present application claims the priority to Chinese Patent Application No. 201910411972.2, titled "BONDING STRUCTURE AND METHOD FOR MANUFACTURING THE SAME", filed on May 17, 2019 with the Chinese Patent Office, which is incorporated herein by reference in its entirety.

TECHNICAL FIELD

The present disclosure relates to the technical field of semiconductor devices and manufacturing thereof, in particular to a bonding structure and a method for manufacturing the bonding structure.

BACKGROUND

With the continuous development of the semiconductor technology, three-dimensional integrated circuit (3D-IC) technology is widely used. In the 3D-IC technology, wafer stacks with different functions are bonded together by the wafer-level packaging technology. The 3D-IC technology has the advantages of a high performance, a low cost, and a high integration level.

In the implementation of wafer-level packaging technology, a Through Silicon Via (TSV) technology is adopted. With the TSV technology, a vertical interconnection between wafers is achieved by forming via holes in the back side of a wafer and filling the via holes with conductive materials. At present, the TSV technology is mainly applied in packaging of two wafers. For the integration of more wafer stacks, the implementation of this technology becomes complex and process problems are prone to occur in manufacturing.

SUMMARY

In view of above, according to the present disclosure, a bonding structure and a method for manufacturing the bonding structure are provided, to form a bonding structure including multiple wafers, so as to implement packaging of multiple wafers and simplify the manufacturing process.

The following technical solutions are provided according to the present disclosure.

A method for manufacturing a bonding structure is provided according to the embodiment of the present disclosure. The method includes:

providing multiple wafers, where each of the wafers has a first surface and a second surface opposite to the first surface; multiple chips arranged in an array are formed on the first surface, and each of the chips includes a device structure, an interconnect structure electrically connected to the device structure, and a first package pad layer electrically connected to the interconnect structure; and the first package pad layer is arranged at an edge region of the chip;

bonding the multiple wafers sequentially by bonding layers, to form a wafer stack;

cutting the wafer stack to obtain a chip stack;

exposing the first package pad layer at the edge region of each of the chips;

providing a package substrate, where the package substrate is provided with electrical connections and a second package pad layer electrically connected to the electrical connections; and electrically connecting the first package pad layer of the chip stack to the second package pad layer of the package substrate.

In an embodiment, in the process of bonding multiple wafers sequentially by bonding layers, bonding of two adjacent wafers includes:

for the first surfaces of the two adjacent wafers further covered with a bonding layer, orienting the first surface of one wafer toward the first surface of the other wafer, and bonding the two wafers by the bonding layer; or for the first surfaces of the two adjacent wafers further covered with a bonding layer, orienting the first surface of one wafer toward the second surface of the other wafer, and bonding the two wafers by the bonding layer.

In an embodiment, in the process of bonding multiple wafers sequentially by bonding layers, the method, before or after bonding two adjacent wafers, further includes:

performing thinning from the second surface of the wafer.

In an embodiment, in the process of bonding multiple wafers sequentially by bonding layers, bonding of two adjacent wafers includes:

for the second surfaces of the two adjacent wafers further covered with a bonding layer, orienting the second surface of one wafer toward the second surface of the other wafer, and bonding the two wafers by the bonding layer.

In an embodiment, two adjacent wafers are thinned from the second surfaces.

In an embodiment, the process of thinning includes:

performing thinning from the second surface of the wafer by an acid etching;

performing thinning from the second surface of the wafer by a chemical mechanical polishing; or performing etching from the second surface of the wafer by an acid etching, and then performing a planarization of the second surface of the wafer by a chemical mechanical polishing, to achieve a thinning of the wafer.

In an embodiment, the process of exposing the first package pad layer at the edge region of each of the chips includes:

polishing a side of the chip stack to expose the first package pad layer at the edge region of the chip.

A bonding structure is provided according to the embodiment of the present disclosure. The bonding structure includes a chip stack and a package substrate. The chip stack is formed by laminating multiple chips in sequence. A bonding layer is arranged between adjacent chips, and each of the chip includes a device structure, an interconnect structure electrically connected to the device structure, and a first package pad layer electrically connected to the interconnect structure. The first package pad layer is arranged at an edge region of the chip. The package substrate is provided with electrical connections and a second package pad layer electrically connected to the electrical connections. The first package pad layer of the chip stack is electrically connected to the second package pad layer of the package substrate.

In an embodiment, the device structures of each the chips of the chip stack are different.

In an embodiment, the number of the chips is three or more.

A bonding structure and a method for manufacturing the bonding structure are provided according to the embodiment of the present disclosure. Multiple chips arranged in an array are formed on the surface of a wafer. Each of the chips includes a device structure, an interconnect structure electrically connected to the device structure, and a first package pad layer electrically connected to the interconnect structure. The first package pad layer is arranged at an edge region of the chip. A chip stack is obtained after bonding and cutting the multiple wafers, and the first package pad layer at the edge region of the chip is exposed. In this way, electrical connections and a second package pad layer electrically connected to the electrical connections are provided on the package substrate, and the first package pad layer of the chip stack can be electrically connected to the second package pad layer of the package substrate. Therefore, the chip stacks are packaged and electrically connected to each other by the package substrate, and it is unnecessary to achieve bonding by forming via holes on the wafer, thereby simplifying the manufacturing process and improving reliability of the chip.

BRIEF DESCRIPTION OF THE DRAWINGS

In order to illustrate the technical solutions in the embodiments of the present disclosure or in conventional technology clearer, the drawings to be used in the description of the embodiments or the conventional technology are briefly described below. Apparently, the drawings in the following description show only some embodiments of the present disclosure, and those skilled in the art can obtain other drawings according to the drawings without any creative work.

DETAILED DESCRIPTION OF THE EMBODIMENTS

Figure 1:
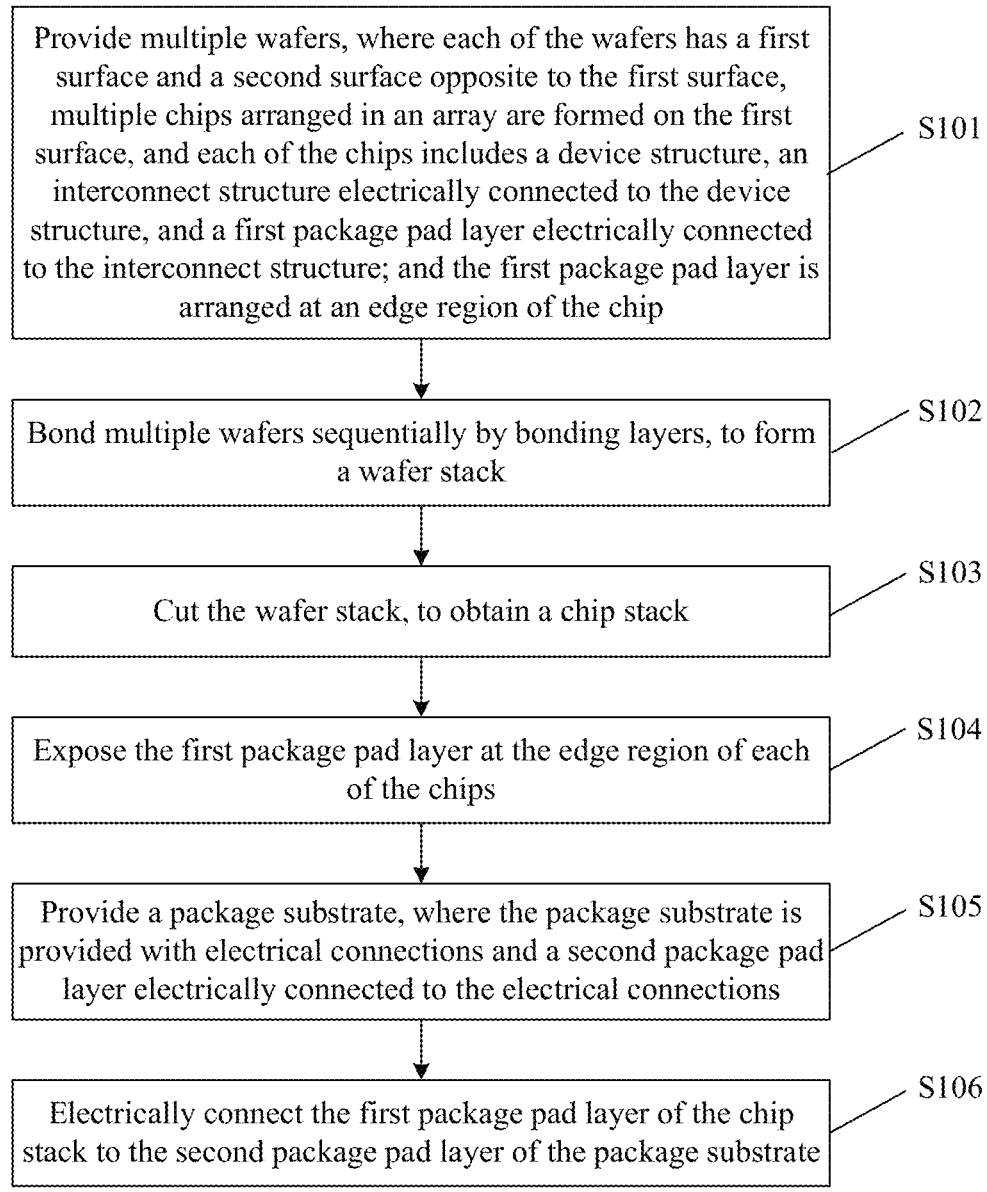
FIG. 1 is a flow chart of a method for manufacturing a bonding structure according to an embodiment of the present disclosure.

In order to make the objects, features and advantages of the present disclosure more apparent, embodiments of the present disclosure are described in detail in the following with reference to the accompanying drawings in the embodiments of the present disclosure.

In the following description, numerous specific details are set forth in order to provide a full understanding of the present disclosure, and the present disclosure may be implemented in other ways than those described herein. Those skilled in the art can make similar promotion without violating the connotation of the present disclosure. Therefore, the present disclosure is not limited by the specific embodiments disclosed below.

The present disclosure is described in detail with reference to the accompanying drawings. In the detailed description of the embodiments of the present disclosure, the cross-sectional view indicating the structure of the device is not partially enlarged in a general scale, the schematic diagram is only an example, and the scope of protection of the present disclosure should not be limited herein. In addition, the actual three-dimensional dimensions of length, width and depth should be included in the actual production.

As described in the background, wafer stacks with different functions are bonded together with the wafer-level packaging technology, and the three-dimensional integrated circuit formed by this method has advantages of a high integration level, a high performance and a low cost. At present, in the implementation of wafer-level packaging technology, a Through Silicon Via technology is adopted, that is, a vertical interconnection between wafers is achieved by forming via holes on the back side of a wafer and filling the via holes with conductive materials.

However, the existing Through Silicon Via technology is mainly applied in packaging of two wafers. For the integration of more wafer stacks, a large number of via holes filled with conductive materials are generated if the Through Silicon Via technology is still adopted, causing the bonding of the wafer to become complicated. Moreover, process problems are prone to occur in the manufacturing process, such as cold solder joint on the pad for electrical connection, broken connection wires, and damaged pad in the bonding process.

Based on the above technical problem, a bonding structure and a method for manufacturing the bonding structure are provided according to the embodiment of the present disclosure. Multiple chips arranged in an array are formed on a surface of a wafer. Each of the chips includes a device structure, an interconnect structure electrically connected to the device structure, and a first package pad layer electrically connected to the interconnect structure, and the first package pad layer is arranged at an edge region of the chip. A chip stack is obtained after bonding and cutting the multiple wafers, and the first package pad layer at the edge region of the chip is exposed. In this way, electrical connections and a second package pad layer electrically connected to the electrical connections are provided on the package substrate, and the first package pad layer of the chip stack can be electrically connected to the second package pad layer of the package substrate. Therefore, the chip stacks are packaged and electrically connected to each other by the package substrate, and it is unnecessary to achieve bonding by forming via holes on the wafer, thereby simplifying the manufacturing process and improving reliability of the chip.

For better understanding of the technical solutions and technical effects of the present disclosure, the specific embodiments are described in detail below with reference to the accompanying drawings.

Reference is made to FIG. 1, which is a flow chart of a method for manufacturing a bonding structure according to an embodiment of the present disclosure. The method may include the following steps S101 to S106.

Figure 3:
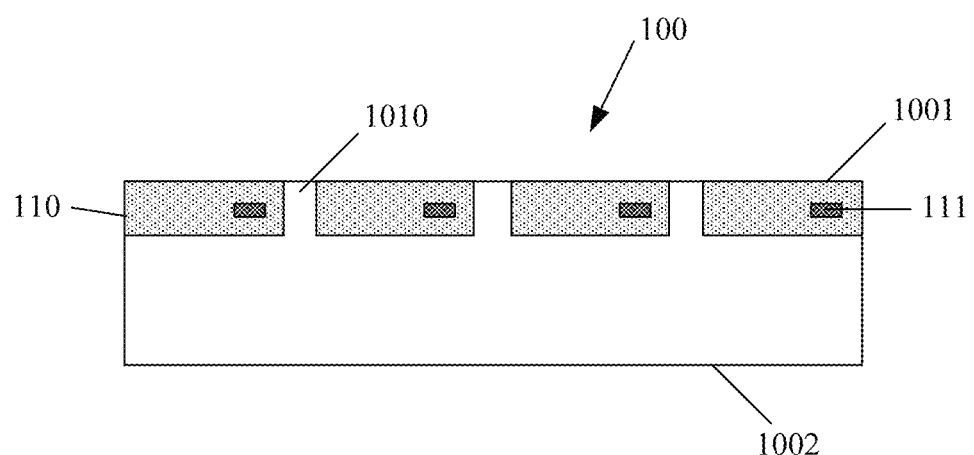
FIG. 3 is a sectional view of a wafer structure according to an embodiment of the present disclosure.

In step S101, multiple wafers 100, 200, 300, and 400 are provided. Each of the wafers 100, 200, 300 and 400 has a first surface 1001 and a second surface 1002 corresponding to the first surface 1001, as shown in FIG. 3.

In the embodiment of the present disclosure, the number of wafers may be three or more. In this case, the bonding of the wafer performed by the Through Silicon Via technology becomes complicated, and the bonding of the wafer can be performed by the method for manufacturing the bonding structure provided by the present disclosure. Practically, it can be understood that the number of wafers may also be two, and the method of the present disclosure is equally applicable to the bonding of two wafers. The fabrication process on each of the to-be-bonded wafers is completed, for example, multiple chips arranged in an array are formed on the wafer.

Each of the wafers may have a first surface and a second surface opposite to the first surface. The second surface is the surface of a substrate, and the substrate may be a semiconductor substrate. Specifically, the substrate may be a bulk substrate or a laminated substrate containing a semiconductor material, such as a Si substrate, a Ge substrate, a SiGe substrate, or an SOI substrate. Multiple chips arranged in an array are formed on the first surface of the substrate to form a first surface of the wafer.

Figure 2:
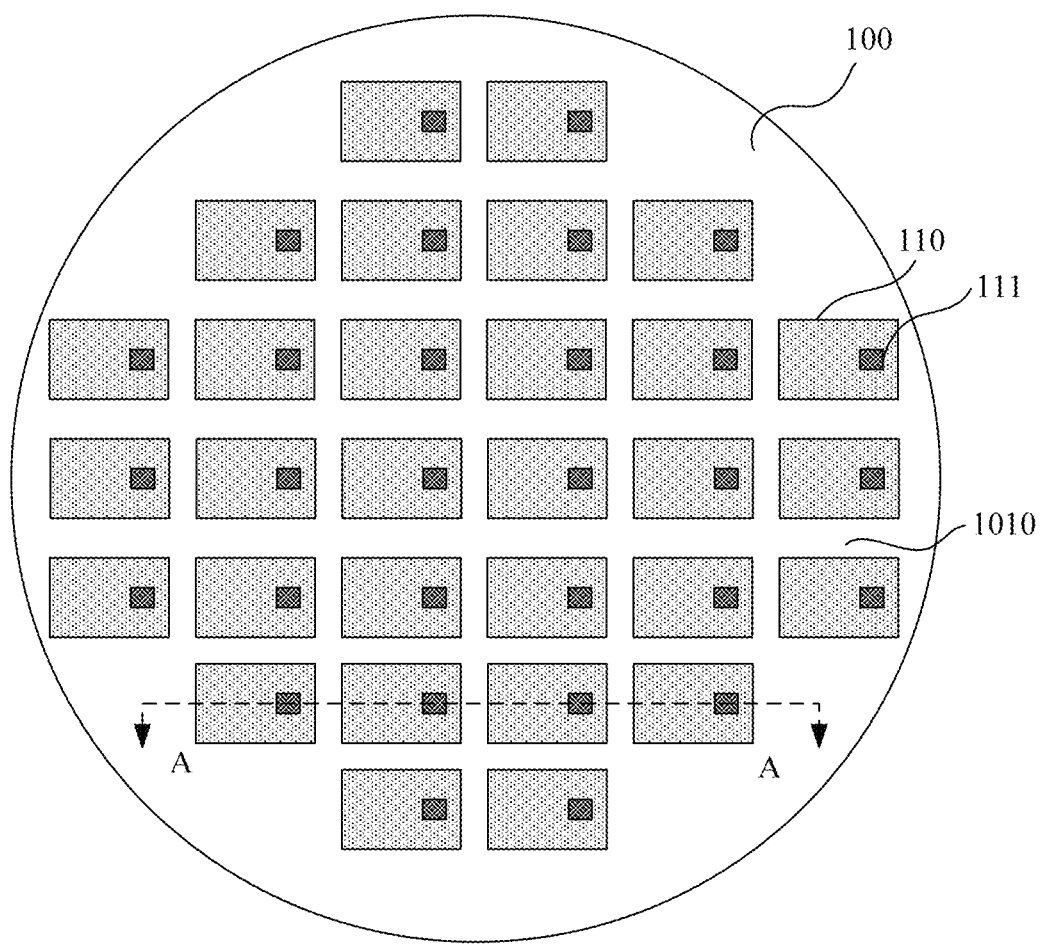
FIG. 2 is a top view of a wafer structure according to an embodiment of the present disclosure.

For ease of understanding, the first wafer 100 is described in detail below as an example. Reference is made to FIG. 2, which is a top view of a wafer structure according to an embodiment of the present disclosure. Multiple first chips 110 arranged in an array are formed on the first wafer 100, and a scribe line 1010 is formed between the first chips 110. The scribe line 1010 divides the wafer into individual first chips 110, for cutting the first wafer 100 in a subsequent process. Reference is made to FIG. 3, which is a sectional view along line AA of the wafer structure in FIG. 2. The first wafer 100 has a first surface 1001 and a second surface 1002 opposite to the first surface 1001. Multiple first chips 110 are formed on the first surface 1001 of the first wafer 100, and a scribe line 1010 is formed between the first chips 110.

A device structure (not shown) may be included in each of chips on the multiple wafers. The device structure may include a metal oxide semiconductor (MOS) field effect transistor device, a memory device, and/or other passive devices. The memory device may include a non-volatile memory or a random access memory, and the non-volatile memory may include, for example, a floating gate field effect transistor, a ferroelectric memory, or a phase change memory, and the floating gate field effect transistor may include, for example, a NOR-type flash memory or a NAND-type flash memory. The device structure may be a planar device or a stereoscopic device, and the stereoscopic device may be, for example, a Fin Field Effect Transistor (FIN-FET), or a three-dimensional memory. In the multiple wafers provided in the embodiments of the present disclosure, the device structures on different wafers may be different, for example, different types of devices or devices of the same type having different operating voltages. The device structures on the same wafer may be the same or different.

Each of the chips on the wafer may further include an interconnect structure (not shown) electrically connected to the device structure, and a first package pad layer electrically connected to the interconnect structure. In this way, the first package pad layer is interconnected with the device structure in the chip, and the first package pad layer, functioning as an electrical connection layer for the final electrical connection between the wafer and the outside, can be configured for electrical connection with other wafers, thereby realizing electrical connection of device structures between different wafers. The material of the first package pad layer is a conductive material, usually a metal material, for example, copper. The first package pad layer may be implemented as, for example, a metal wire or a metal gasket.

The first package pad layer may be arranged at an edge region of the chip, that is, the first package pad layer is closer to an edge of one side of the chip. The distance between the first package pad layer and the edge may be determined according to actual conditions. Generally, a shorter distance between the first package pad layer and the edge is beneficial to improve the utilization of the wafer.

The first package pad layers in different chips on the same wafer may be arranged on the same side of the chip. For example, the first package pad layers 111 in the first wafer 100 are all arranged on the right edges of the first chips 110, as shown in FIG. 2. Practically, the first package pad layers in different chips may also be arranged in edge regions in different directions. For example, the first package pad layer in one of the chips on the wafer may be arranged in the left edge region of the chip, and the first package pad layer in another chip on the wafer may be arranged in the right edge region of the another chip.

Figure 4:
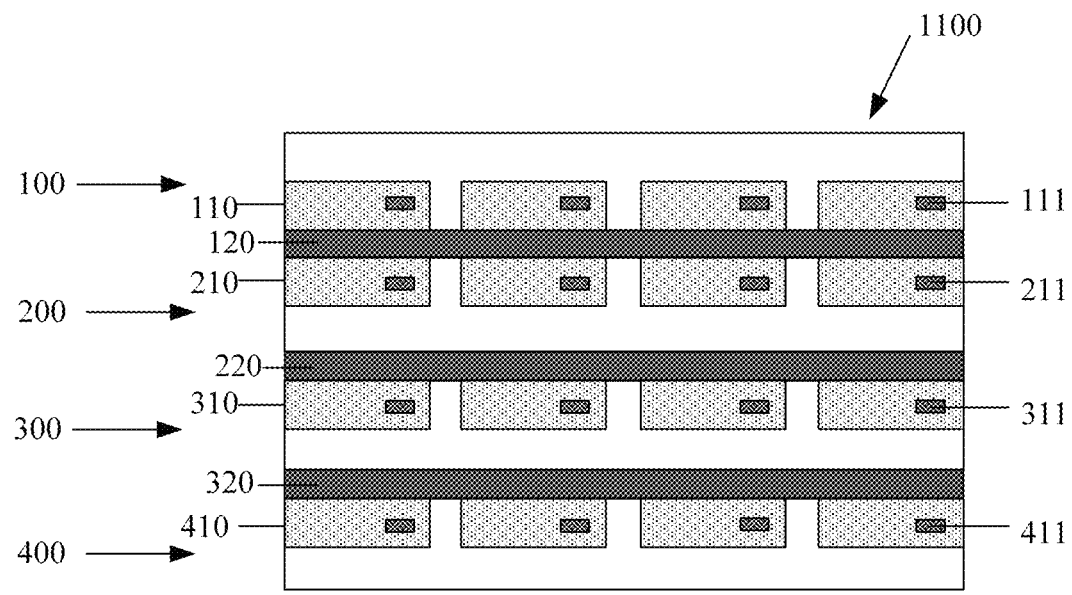
FIG. 4 is a schematic diagram of a wafer stack according to an embodiment of the present disclosure.

In step S102, the multiple wafers 100, 200, 300, and 400 are sequentially bonded by bonding layers 120, 220, and 320, to form a wafer stack 1100, as shown in FIG. 4.

Two wafers can be bonded together by a bonding layer on the surface of the wafer. Specifically, two wafers may be bonded together by a bonding technology of intermolecular chemical force of the bonding layer, and the material of the bonding layer may be, for example, silicon oxide, silicon nitride, or a combination thereof. In the embodiment of the present disclosure, multiple wafers may be sequentially bonded by the bonding layers between multiple wafers to form a wafer stack.

A wafer stack formed by four wafers is taken as an example. Reference is made to FIG. 4, which a sectional view of a wafer stack according to an embodiment of the present disclosure. The wafer stack 1100 includes a first wafer 100, a second wafer 200, a third wafer 300, and a fourth wafer 400. The first wafer 100 includes multiple first chips 110, and each of the first chips 100 includes a first package pad layer 111. The second wafer 200 includes multiple second chips 210, and each of the second chips 210 includes a first package pad layer 211. The third wafer 300 includes multiple third chips 310, and each of the third chips 310 includes a first package pad layer 311. The fourth wafer 400 includes multiple fourth chips 410, and each of the fourth chips 410 includes a first package pad layer 411. The first wafer 100 and the second wafer 200 may be bonded by the first bonding layer 120, the second wafer 200 and the third wafer 300 may be bonded by the second bonding layer 220, and the third wafer 300 and the fourth wafer 400 may be bonded by the third bonding layer 320.

Wafer bonding may be performed by a bonding device. In the bonding process by using the bonding layer, sequential bonding of multiple wafers can be realized by two-two bonding of the wafers. The bonding surface between two adjacent wafers may be determined according to actual conditions. For example, a first surface of one wafer may be oriented toward a first surface of the other wafer, and the two wafers are bonded by the bonding layer. Alternatively, a first surface of one wafer may be oriented toward a second surface of the other wafer, and the two wafers are bonded by the bonding layer. Alternatively, a second surface of one wafer may be oriented toward a second surface of the other wafer, and the two wafers are bonded by the bonding layer.

In a specific implementation, a bonding layer may be covered on the first surface of the wafer, such that the first surface of the wafer may be oriented toward the first surface or the second surface of another wafer, and the wafer is bonded with another wafer by the bonding layer. In this case, the second surface of the wafer is oriented outward to protect the device structure formed on the first surface. Practically, in an implementation, the bonding layer may also be covered on the second surface of the wafer, such that the second surface of the wafer may be oriented toward the first surface or the second surface of another wafer, thus the wafer is bonded with another wafer by the bonding layer. In this case, the first surfaces of the two wafers are oriented outward.

It can be understood that, the second surface of the uppermost wafer and the second surface of the lowermost wafer in the finally formed wafer stack, can be oriented outward. In this structure, the first surface of each wafer is protected without an additional protection process, thereby simplifying the process.

Referring to FIG. 4, the first surface of the first wafer 100 is bonded to the first surface of the second wafer 200, the second surface of the second wafer 200 is bonded to the first surface of the third wafer 300, and the second surface of the third wafer 300 is bonded to the first surface of the fourth wafer 400, so that the second surface of the first wafer 100 and the second surface of the fourth wafer 400 are oriented outward, thereby omitting the protection process of the first surfaces of the wafers.

In the embodiment of the present disclosure, two wafers may be thinned from the second surfaces before or after bonding the two wafers, thereby reducing redundant components and reducing the size of the device. Specifically, for the bonded wafer with the second surface oriented outward, the wafer may be thinned from the second surface before or after bonding. For example, the first surfaces of the two wafers can be arranged opposite to each other and bonded by the bonding layer, and then thinning is performed separately from the second surfaces of the two wafers. For the bonded wafer with the first surface oriented outward, the wafer may be thinned from the second surface before bonding. For example, for a wafer having a second surface covered with a bonding layer, the wafer may be thinned from the second surface, and then covered with the bonding layer.

In an implementation, the second surface of the wafer may be thinned by an acid etching, in which the rate of thinning is fast.

In another implementation, the second surface of the wafer may be thinned by a chemical mechanical polishing, in which the surface after thinning is relatively flat.

In another implementation, the second surface of the wafer may be etched by an acid etching, etching a portion of the substrate material in the wafer, and then the planarization of the second surface of the wafer is performed by a chemical mechanical polishing, to achieve a thinning of the wafer. In this way, the efficiency of thinning the wafer can be improved, and the second surface of the thinned wafer is relatively flat.

Figure 5:
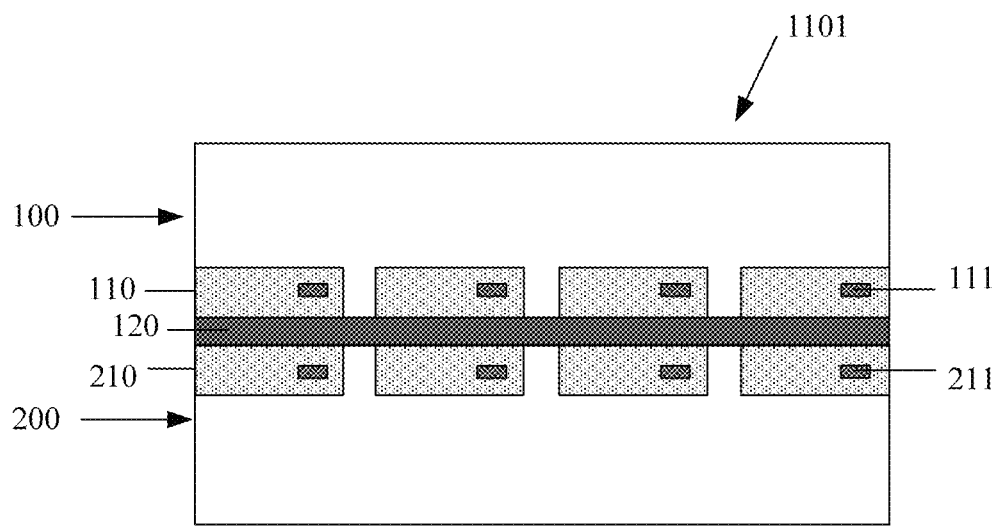
FIG. 5 is a schematic diagram of a wafer stack according to another embodiment of the present disclosure.
Figure 6:
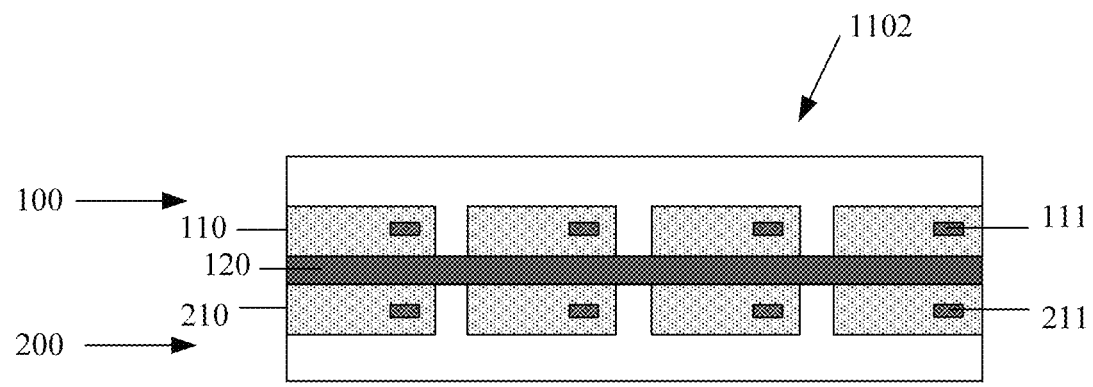
FIG. 6 is a schematic diagram of a wafer stack according to another embodiment of the present disclosure.
Figure 7:
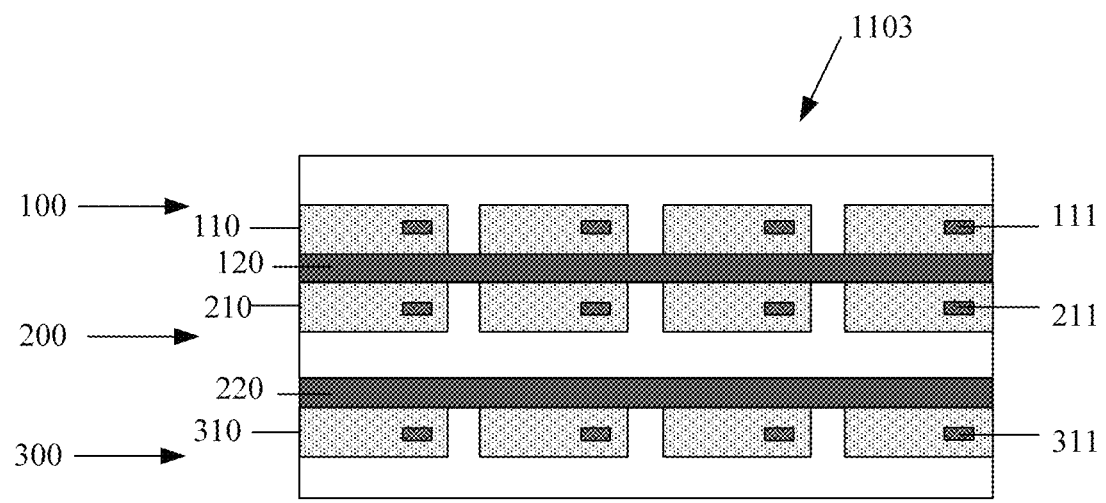
FIG. 7 is a schematic diagram of a wafer stack according to another embodiment of the present disclosure.

In a specific embodiment, a wafer stack 1100 having four layers of wafers is formed, as shown in FIG. 4. First, the first surface of the first wafer 100 and the first surface of the second wafer 200 may be bonded together by the bonding layer 120, to obtain a first wafer stack 1101, as shown in FIG. 5. Then, the first wafer and the second wafer are thinned from the second surfaces, to obtain a second wafer stack 1102, as shown in FIG. 6. Then, the second surface of the second wafer 200 and the first surface of the third wafer 300 are bonded together by the bonding layer 220, and the third wafer 300 is thinned from the second surface, to obtain a third wafer stack 1103, as shown in FIG. 7. Finally, the second surface of the third wafer 300 and the first surface of the fourth wafer 400 are bonded together by the bonding layer 320, and the fourth wafer 400 is thinned from the second surface, to obtain a final wafer stack 1100, as shown in FIG. 4.

It should be noted that each of the bonding layers 120, 220, and 320 between the wafers may have a single layer or multiple layers; and may be obtained by bonding the bonding layers formed on the opposite surfaces of the two adjacent wafers, or may be obtained by bonding the bonding layers formed on one of the opposite surfaces of the two adjacent wafers.

Figure 8:
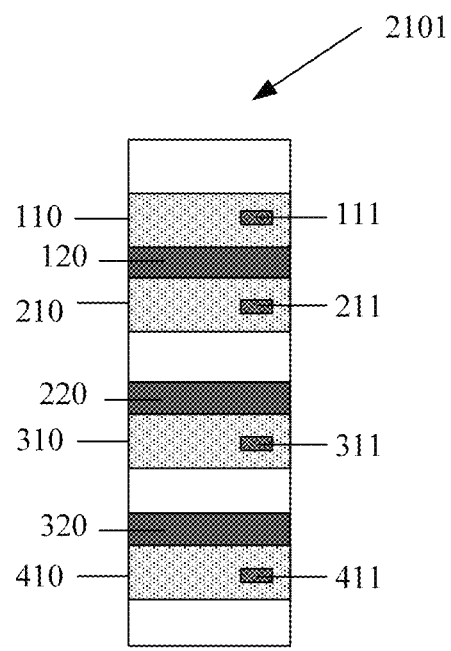
FIG. 8 is a schematic diagram of a chip stack according to an embodiment of the present disclosure.

In step S103, the wafer stack 1100 is cut, to obtain a chip stack 2101, as shown in FIG. 8.

In the embodiment of the present disclosure, the wafer stack 1100 may be cut along the scribe lines between the chips in the wafer stack, to obtain multiple chip stacks 2101. Reference is made to FIG. 8, which is a schematic diagram of a chip stack according to an embodiment of the present disclosure. In FIG. 8, one chip stack 2101 includes multiple vertically interconnected chips, that is, a first chip 110 in the first wafer 100, a second chip 210 in the wafer 200, a third chip 310 in the third wafer 300, and a fourth chip 410 in the fourth wafer 400. It can be understood that these chips belong to different wafers, and the number of chips in each chip stack 2101 is the same as the number of wafers in the wafer stack 1100.

In the chip stack, the first package pad layers 111, 211, 311, and 411 in the respective chips 110, 210, 310, and 410 are arranged at an edge region of the chip, and the specific position of the first package pad layers may be determined according to actual conditions. The first package pad layers in the same chip stack 2101 are not limited to locate on the same side in the embodiment of the present disclosure. In an actual operation, the first package pad layers 111, 211, 311, and 411 in the respective chips 110, 210, 310, and 410 of the chip stack 2101 may be arranged on the same side, for example, the first package pad layer in each chip may be arranged on the right edge of the chip; or the first package pad layers in the chips of the chip stack may be arranged on different sides. For example, the first package pad layer in the first chip may be arranged in the left edge region of the first chip, and the first package pad layer in the third chip may be arranged in the right edge region of the third chip.

Figure 9:
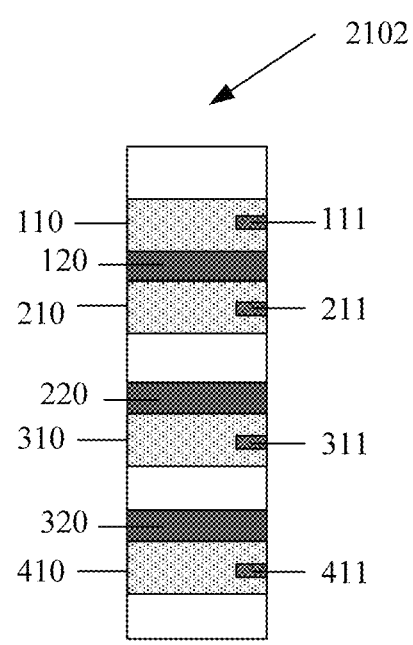
FIG. 9 is a schematic diagram of a chip stack according to another embodiment of the present disclosure.

In step S104, the first package pad layers 111, 211, 311, and 411 at the edge regions of the respective chips 110, 210, 310, and 410 are exposed, as shown in FIG. 9.

In the embodiment of the present disclosure, the first package pad layer is configured for electrical connection with an external circuit or other chip. Therefore, the dielectric material outside the first package pad layer may be removed to expose the first package pad layer at the edge region of the chip after the chip stack is formed, thereby achieving the electrical connection between the first package pad layer and the external circuit or other chip.

Reference is made to FIG. 9, which is a schematic diagram of a chip stack after the first package pad layer is exposed according to an embodiment of the present disclosure. In the chip stack 2102, the exposed first package pad layers 111, 211, 311, and 411 can be electrically connected to an external circuit or other chip.

The first package pad layer at the edge region of the chip may be exposed by polishing the side of the chip stack. The polishing may be performed by an acid etching, or by a chemical mechanical polishing, or by an acid etching first and then chemical mechanical polishing, to expose each of the first package pad layers, which is not limited herein.

In the embodiment of the present disclosure, the exposed first package pad layer may be flush with the sidewall of the chip stack or may protrude from the sidewall of the chip stack.

Figure 10:
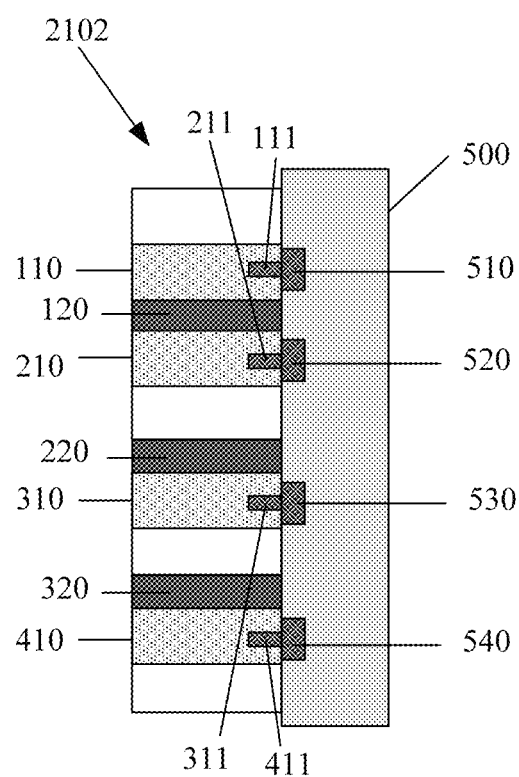
FIG. 10 is a schematic diagram of a bonding structure according to an embodiment of the present disclosure.

In step S105, a package substrate 500 is provided, which is provided with electrical connections and second package pad layers 510, 520, 530, and 540 electrically connected to the electrical connections, as shown in FIG. 10.

The package substrate is configured to package the chip stack, and different chips of the chip stack can be electrically connected to each other according to actual needs. The package substrate may be provided with electrical connections and a second package pad layer electrically connected to the electrical connections. The electrical connections are configured to electrically connect different second package pad layers. The chip stack and the package substrate are packaged by the connection relationship between the electrical connections to achieve the electrical connection between the chips of the chip stack. The material of the second package pad layer is a conductive material, usually a metal material, for example, copper. The second package pad layer may be implemented as, for example, a metal wire or a metal gasket.

Referring to FIG. 10, the package substrate 500 is provided with electrical connections (not shown) and second package pad layers 510, 520, 530, and 540 electrically connected to the electrical connections. The second package pad layers may be electrically connected to each other by the electrical connections according to actual needs.

In the embodiment of the present disclosure, the second package pad layer may be flush with the package substrate or may protrude from the surface of the package substrate.

One chip stack may be provided with one or more package substrates 500. The electrical connections and the second package pad layer 510 in the respective package substrates may be configured according to actual conditions.

In step S106, the first package pad layers 111, 211, 311, and 411 of the chip stack 2102 are electrically connected to the second package pad layers 510, 520, 530, and 540 in the package substrate 500, as shown in FIG. 10.

In the above, the first package pad layer exposed outside the chip stack and the second package pad layer arranged on the package substrate are obtained. The first package pad layer is electrically connected to the device structure in the chip through the interconnect structure, and the second package pad layer is electrically connected to another second package pad layer via the electrical connections in the package substrate. Therefore, if the first package pad layer of the chip stack is electrically connected to the second package pad layer of the package substrate, the electrical connection between different chips can be realized by the second package pad layer and the electrical connection electrically connected to the second package pad layer.

Reference is made to FIG. 10, which is a schematic diagram of a bonding structure according to an embodiment of the present disclosure. Specifically, the first package pad layer 111, in the first chip 110 of the chip stack 2102, is electrically connected to the second package pad layer 510; the first package pad layer 211, in the second chip 210 of the chip stack 2102, is electrically connected to the second package pad layer 520; the first package pad layer 311, in the third chip 310 of the chip stack 2102, is electrically connected to the second package pad layer 530; and the first package pad layer 411, in the fourth chip 410 of the chip stack 2102, is electrically connected to the second package pad layer 540.

Taking the electrical connection between the second package pad layers 510 and 520 via an electrical connection as an example, the device structure, in the first chip 110 of the chip stack 2102, is electrically connected to the first package pad layer 111 in the first chip 110; the first package pad layer 111 is electrically connected to some of the second package pad layers 510, and some of the second package pad layers 510 may be electrically connected to some second package pad layers 520 via the electrical connections; and some other second package pad layers 520 may be electrically connected to the first package pad layer 211 in the second chip 210 of the chip stack 2102, and the first package pad layer 111 in the second chip 210 is electrically connected to the device structure in the second chip 210. Therefore, the device structure in the first chip 110 is electrically connected to the device structure in the second chip 210, through the first package pad layer 111, the second package pad layer 510, the electrical connections in the package substrate, the second package pad layer 520, and the first package pad layer 211. That is, the electrical connections between the different chips of the chip stack 2102 can be achieved by the electrical connection of the chip stack 2102 and the package substrate 500.

The first package pad layer 111 and the second package pad layer 510 may be connected by direct soldering. For example, the first package pad layer 111 and the second package pad layer 510 may be electrically connected to each other by forming solder balls or pads on the first package pad layer 111 and the second package pad layer 510. The first package pad layer 111 and the second package pad layer 510 may also be connected to each other by an electrical connection. For example, the electrical connection may be soldered to the first package pad layer 111 and the second package pad layer 510. The first package pad layer 111 and the second package pad layer 510 may also be electrically connected to each other by a hybrid boning technology.

In the embodiment of the present disclosure, the number of the package substrates electrically connected to the same chip stack may be one or more, and the number of the package substrates may be determined according to actual conditions.

In a case that the same chip stack has one package substrate, the first package pad layers of the chip stack may be arranged on the same side, so that the second package pad layers in the package substrate may be directly connected to the first package pad layers by soldering or intermolecular chemical bonding; or the first package pad layers of the chip stack may be arranged on different sides, and the second package pad layers in the package substrate may be connected to the first package pad layers via electrical connections.

In a case that the same chip stack has multiple package substrates, the first package pad layers of the chip stack may be arranged on different sides, based on the position of the package substrate and the positions of the second package pad layers of the package substrate, so that the second package pad layers may be directly connected to the first package pad layers by soldering or intermolecular chemical bonding; or the first package pad layers of the chip stack may be arranged on the same side, and the second package pad layers may be connected to the first package pad layers via electrical connections.

After the first package pad layer of the chip stack is electrically connected to the second package pad layer of the package substrate, other packaging steps may be performed to form a packaged bonding structure.

A method for manufacturing a bonding structure is provided according to the embodiment of the present disclosure. Multiple chips arranged in an array are formed on a surface of a wafer. Each of the chips includes a device structure, an interconnect structure electrically connected to the device structure, and a first package pad layer electrically connected to the interconnect structure. The first package pad layer is arranged at an edge region of the chip. A chip stack is obtained after bonding and cutting the multiple wafers, and the first package pad layer at the edge region of the chip is exposed. In this way, electrical connections and a second package pad layer electrically connected to the electrical connections are provided on the package substrate, and the first package pad layer of the chip stack can be electrically connected to the second package pad layer of the package substrate. Therefore, chip stacks are packaged and electrically connected to each other by the package substrate, and it is unnecessary to achieve bonding by forming via holes on the wafer, thereby simplifying the manufacturing process and improving reliability of the chip.

Based on the method for manufacturing a bonding structure provided in the above embodiment, a bonding structure is further provided according to an embodiment of the present disclosure. Referring to FIG. 10, the bonding structure includes: a chip stack 2102 and a package substrate 500.

The chip stack 2102 is formed by laminating multiple chips 110, 210, 310, and 410 in sequence. Bonding layers 120/220/320 are arranged between adjacent chips, and each of the chips 110/210/310/410 includes a device structure, an interconnect structure electrically connected to the device structure, and a first package pad layer 111/211/311/411 electrically connected to the interconnect structure. The first package pad layer 111/211/311/411 is arranged at an edge region of the chip 110/210/310/410.

The package substrate 500 is provided with electrical connections and second package pad layers 510, 520, 530, and 540 electrically connected to the electrical connections. The first package pad layers 111, 211, 311, and 411 of the chip stack 2102 are electrically connected to the second package pad layers 510, 520, 530, and 540 of the package substrate 500.

In an embodiment, the device structures of each chips of the chip stack are different.

In an embodiment, the number of the chips is three or more.

The various embodiments of the present disclosure are described in a progressive manner, each embodiment focuses on differences from other embodiments, and the same or similar parts between the various embodiments may be referred to each other. In particular, for the memory device disclosed in the embodiments, since the principle is the same as the method disclosed in the embodiments, the description is relatively simple. For the relevant parts, one may refer to the method part.

Only preferred embodiments of the present disclosure are described above, and are not intended to limit the disclosure in any way. Those skilled in the art, without departing from the technical solutions of the present disclosure, can make many possible variations and modifications to the technical solutions of the present disclosure or modify them into equivalent embodiments by using the methods and technical contents disclosed above. These variations, modifications and equivalent embodiments also fall into the protection scope of the present disclosure.

The invention claimed is:

1. A method for manufacturing a bonding structure, comprising:
   providing a plurality of wafers, wherein each of the plurality of wafers has a first surface and a second surface opposite to the first surface; a plurality of chips arranged in an array is formed on the first surface, and each of the plurality of chips comprises a device structure, an interconnect structure electrically connected to the device structure, and a first package pad layer electrically connected to the interconnect structure; and the first package pad layer is arranged at an edge region of the chip;
   bonding the plurality of wafers via bonding layers, to form a wafer stack;
   cutting the wafer stack along a scribe line located among the plurality of chips to obtain a chip stack;
   exposing the first package pad layer at the edge region of each chip in the chip stack;
   providing a package substrate, wherein the package substrate is provided with electrical connections and a second package pad layer electrically connected to the electrical connections; and
   electrically connecting the first package pad layer of each chip in the chip stack to the second package pad layer of the package substrate.

2. The method according to claim 1, wherein bonding the plurality of wafers via the bonding layers comprises:
   for two adjacent wafers in the wafer stack,
   bonding the first surface of one wafer to the first surface of the other wafer via one of the bonding layers; or
   bonding the first surface of one wafer to the second surface of the other wafer via one of the bonding layers.

3. The method according to claim 2, wherein bonding the plurality of wafers via the bonding layers comprises:
   performing thinning from the second surface of one of the plurality of wafers; and
   bonding the one of the plurality of wafers to another of the plurality of wafers, before or after the thinning.

4. The method according to claim 1, wherein bonding the plurality of wafers via the bonding layers comprises:
   for two adjacent wafers in the wafer stack, bonding the second surface of one wafer to the second surface of the other wafer via one of the bonding layers.

5. The method according to claim 4, wherein bonding the plurality of wafers via the bonding layers further comprises:
   thinning the two adjacent wafers from the second surfaces.

6. The method according to claim 3, wherein thinning comprises:
   performing thinning from the second surface of the one of the plurality of wafers by an acid etching;
   performing thinning from the second surface of the one of the plurality of wafers by a chemical mechanical polishing; or
   performing etching from the second surface of the one of the plurality of wafers by an acid etching, and then planarizing the second surface of the one of the plurality of wafers by a chemical mechanical polishing.

7. The method according to claim 1, wherein the exposing the first package pad layer at the edge region of each chip in the chip stack comprises:
   polishing a side of the chip stack to expose the first package pad layer at the edge region of each chip in the chip stack.

8. The method according to claim 5, wherein the thinning comprises:
   performing thinning from the second surfaces of the two adjacent wafers by an acid etching;
   performing thinning from the second surfaces of the two adjacent wafers by a chemical mechanical polishing; or
   performing etching from the second surfaces of the two adjacent wafers by an acid etching, and then planarizing the second surfaces of the two adjacent wafers by a chemical mechanical polishing.

9. A bonding structure, comprising:
a chip stack formed by laminating chips in sequence, wherein a bonding layer is arranged between every two adjacent ones of the chips, and each chip comprises:
a device structure,
an interconnect structure electrically connected to the device structure, and
a first package pad layer electrically connected to the interconnect structure,
wherein the first package pad layer is arranged at an edge region of said chip; and a package substrate, provided with electrical connections and a second package pad layer electrically connected to the electrical connections,
wherein the first package pad layer of each chip in the chip stack is electrically connected to the second package pad layer of the package substrate.

10. The bonding structure according to claim 9, wherein the device structures of the chips of the chip stack are different.

11. The bonding structure according to claim 9, wherein a quantity of the chips is three or more.

12. The bonding structure according to claim 9, wherein no via hole is provided in the bonding structure to electrically connect different ones of the chips.

* * * * *